US010318227B2

(12) United States Patent
Shin et al.

(10) Patent No.: US 10,318,227 B2
(45) Date of Patent: Jun. 11, 2019

(54) NON-RECTANGULAR DISPLAY DEVICE AND MULTIPLE-DISPLAY DEVICE

(71) Applicant: LG Display Co., Ltd., Seoul (KR)

(72) Inventors: HyungBeom Shin, Goyang-si (KR); DukKeun Yoo, Seoul (KR); ChanHo Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 100 days.

(21) Appl. No.: 15/683,128

(22) Filed: Aug. 22, 2017

(65) Prior Publication Data

US 2018/0150274 A1 May 31, 2018

(30) Foreign Application Priority Data

Nov. 28, 2016 (KR) .................. 10-2016-0159288

(51) Int. Cl.
*G06F 3/14* (2006.01)
*G09G 3/00* (2006.01)
(Continued)

(52) U.S. Cl.
CPC ........ *G06F 3/1446* (2013.01); *G02F 1/13452* (2013.01); *G02F 1/13454* (2013.01); *G02F 1/136286* (2013.01); *G06F 3/147* (2013.01); *G09G 3/003* (2013.01); *G09G 3/3648* (2013.01); *G02F 1/1337* (2013.01); *G02F 1/13336* (2013.01); *G02F 2201/56* (2013.01);
(Continued)

(58) Field of Classification Search
CPC ............. G02F 2201/56; G02F 1/13454; G02F 1/136286; G06F 3/1446; G09G 2300/026; G09G 3/3677
See application file for complete search history.

(56) References Cited

U.S. PATENT DOCUMENTS

2008/0018557 A1* 1/2008 Maeda .................... G02F 1/167
345/55
2010/0156945 A1* 6/2010 Yoshida ................ G02F 1/1345
345/690
(Continued)

FOREIGN PATENT DOCUMENTS

EP 3057084 A2 * 8/2016 ......... G02F 1/13454
JP 2014-103163 A 6/2014
(Continued)

*Primary Examiner* — Laurence J Lee
(74) *Attorney, Agent, or Firm* — Birch, Stewart, Kolasch & Birch, LLP

(57) ABSTRACT

A display device can include a display panel including data lines and gate lines on a triangular-shaped board, and a plurality of pixels in a matrix arrangement, in which pixel rows are arranged with a step for each at least one gate line among the gate lines based on a number of the plurality of pixels connected to each of the gate lines; a data-driving unit on a first side of the triangular-shaped board, and configured to supply data voltages to the data lines to drive the data lines; and a gate-driving unit including a plurality of gate-in-panels (GIPs) on a second side of the triangular-shaped board, in which the plurality of gate-in-panels are arranged to correspond to the step for each of the at least one gate line and sequentially supply a gate signal to the plurality of gate lines to sequentially drive the gate lines.

20 Claims, 22 Drawing Sheets

(51) Int. Cl.
*G09G 3/36* (2006.01)
*G06F 3/147* (2006.01)
*G02F 1/1333* (2006.01)
*G02F 1/1337* (2006.01)
*G02F 1/1345* (2006.01)
*G02F 1/1362* (2006.01)

(52) U.S. Cl.
CPC ......... *G09G 3/3677* (2013.01); *G09G 3/3688* (2013.01); *G09G 2300/026* (2013.01); *G09G 2300/0426* (2013.01); *G09G 2300/0452* (2013.01); *G09G 2310/0283* (2013.01)

(56) References Cited

U.S. PATENT DOCUMENTS

2017/0123285 A1\* 5/2017 Suzuki ................ G02F 1/13306
2018/0337217 A1\* 11/2018 Zang .................... H01L 27/322

FOREIGN PATENT DOCUMENTS

| JP | 2015-84104 A | 4/2015 |
|----|----|----|
| KR | 10-2002-0057812 A | 7/2002 |
| KR | 10-2009-0041336 A | 4/2009 |
| KR | 10-2014-0086605 A | 7/2014 |
| WO | WO 2008/062575 A1 | 5/2008 |

\* cited by examiner 20-sided figure    80-sided figure    180-sided figure    320-sided figure
(globular shape)

40-sided figure    105-sided figure    160-sided figure
(hemispheric shape)

NON-RECTANGULAR DISPLAY DEVICE AND MULTIPLE-DISPLAY DEVICE

CROSS REFERENCE TO RELATED APPLICATION

This application claims priority from Korean Patent Application No. 10-2016-0159288, filed in the Republic of Korea on Nov. 28, 2016, which is hereby incorporated by reference for all purposes as if fully set forth herein.

BACKGROUND OF THE INVENTION

Field of the Invention

The present invention relates to a display device for displaying an image, and a multiple-display device which embodies a polyhedron by combining display devices.

Description of the Related Art

With the development of the information society, display devices for displaying images are being increasingly required in various forms, and various types of display devices, such as Liquid Crystal Display (LCD) devices, Plasma Display Panels (PDP), and Organic Light-Emitting Diode (OLED) display devices, are utilized.

Generally, a display device has a rectangular-shaped display panel. Normal display devices may be combined into a large-size screen to continuously display an image, but have limitations as to the ability to embody a polyhedron and display an image continuously in three dimensions.

SUMMARY OF THE INVENTION

An aspect of the present invention is to provide a display device to be used for producing a multiple-display device.

Another aspect of the present invention is to provide a multiple-display device which continuously displays a single image in three dimensions.

In accordance with an aspect of the present invention, there is provided a display device, including: a display panel in which a plurality of data lines and a plurality of gate lines are disposed on a triangular-shaped board, and a plurality of pixels is disposed in a matrix arrangement, in which a plurality of pixel rows is disposed to have a step for each at least one gate line by controlling the number of the plurality of pixels connected to each of the plurality of gate lines; a data-driving unit disposed on a first side of the triangular-shaped board and configured to supply a data voltage to the plurality of data lines to drive the plurality of data lines; and a gate-driving unit including a plurality of gate-in-panels, disposed to correspond to the step, on a second side of the triangular-shaped board, in which the plurality of gate-in-panels sequentially supplies a gate signal to the plurality of gate lines to sequentially drive the plurality of gate lines.

In accordance with another aspect of the present invention, there is provided a display device, including: a display panel in which a plurality of data lines and a plurality of gate lines are disposed on a triangular-shaped board and two adjacent triangular-shaped pixels provided in a second direction are disposed in a matrix arrangement including a plurality of pixels disposed in a parallelogram shape, the pixels being disposed to correspond to the triangular-shaped board by controlling the number of the plurality of pixels connected to each of the plurality of gate lines; a data-driving unit, disposed on a first side of the triangular-shaped board and configured to supply a data voltage to the plurality of data lines to drive the plurality of data lines; and a gate-driving unit, disposed on the first side and configured to sequentially supply a gate signal to the plurality of gate lines to sequentially drive the plurality of gate lines.

According to embodiments of the present invention, a display device can be used to manufacture a multiple-display device.

Also, according to embodiments of the present invention, a multiple-display device can continuously display a single image in three dimensions.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EMBODIMENTS

Figure 1:
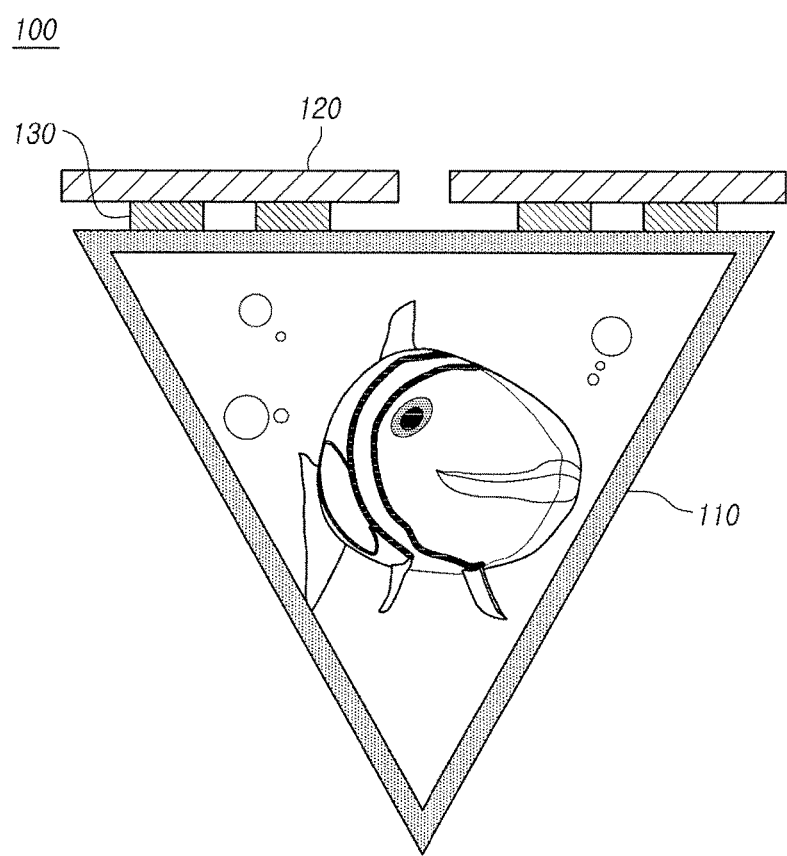
FIG. 1 is a plan view of a display device according to an embodiment.

Hereinafter, some embodiments of the present invention will be described in detail with reference to the accompanying illustrative drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

FIG. 1 is a plan view of a display device according to an embodiment.

Referring to FIG. 1, a display device 100 according to an embodiment includes a triangular-shaped display panel 110, a driving unit 120 for driving the display panel 110, and a connecting unit 130 located between the display panel 110 and the driving unit 120. The display device 100 can include devices such as a Liquid Crystal Display (LCD), a Plasma Display Panel (PDP), an Organic Light-Emitting Diode (OLED) display device, and the like.

The display panel 110 can independently display an image in a triangular shape, or can be coupled to another display device and display a continuous image. The display panel 110 can be provided in a regular triangular shape or an isosceles-triangular shape, but is not limited thereto.

For example, when the display panel 110 is provided in a triangular shape, this indicates that the overall shape is provided in a triangular shape. Therefore, three sides of the display panel 110 can form curved surfaces, as opposed to straight lines from the perspective of mathematics, or the ends of some or all of the three sides can be bent. Also, some of the vertices of the display panel 110 can be cut or rounded. Hereinafter, the description will be provided under the assumption that the display panel 110 is provided in a mathematical triangular-shape.

The driving unit 120 is disposed on one side of the display panel 110, and can drive or control the display panel 110 through the connecting unit 130. The driving unit 120 can be one of a data-driving unit, a gate-driving unit, a controller for controlling them, and a touch driving unit of a normal display device, or a combination thereof. Hereinafter, although the driving unit 120 is described as a data-driving unit and a gate-driving unit, this is not limiting.

The connecting unit 130 can be disposed between the display panel 110 and the driving unit 120, and can deliver a driving signal of the driving unit 120 and/or a control signal to the display panel 110. For example, the connecting unit 130 can connect the display panel 110 and the driving unit 120 based on, for example, a Tape-Automated-Bonding (TAB) scheme.

The driving unit 120 can be connected with a bonding pad of the display panel 110 based on a Chip-On-Glass (COG) scheme, or can be directly disposed on the display panel 110. In some instances, the driving unit 120 can also be integrated on the display panel 110. For example, the display device 100 may not separately include the connecting unit 130.

Figure 2:
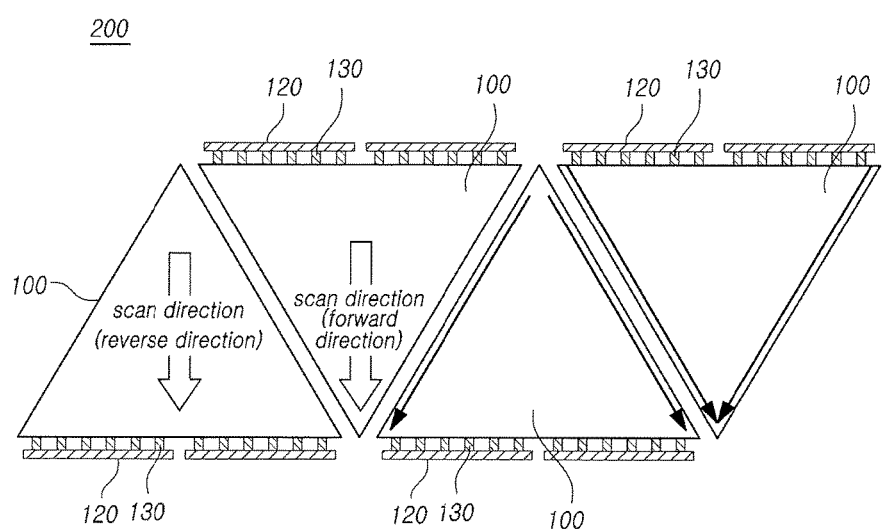
FIG. 2 is an exploded view of a multiple-display device in which a plurality of display devices of FIG. 1 is assembled according to an embodiment.

FIG. 2 is an exploded view of a multiple-display device in which a plurality of display devices of FIG. 1 is assembled.

Referring to FIG. 2, in a multiple-display device 200 according to an embodiment, the display device 100 of FIG. 1 is used as a unit display device, and two or more display devices 100 can be assembled through a connecting member into the multiple-display device 200. Each display device 100 can include the display panel 110, the driving unit 120, and the connecting unit 130, as illustrated in FIG. 1. For example, in the multiple-display device 200, two adjacent display devices 100 form a parallelogram, and the sides of the display devices 100 where the driving units 120 are disposed can form two base lines of the parallelogram.

Figure 3A:
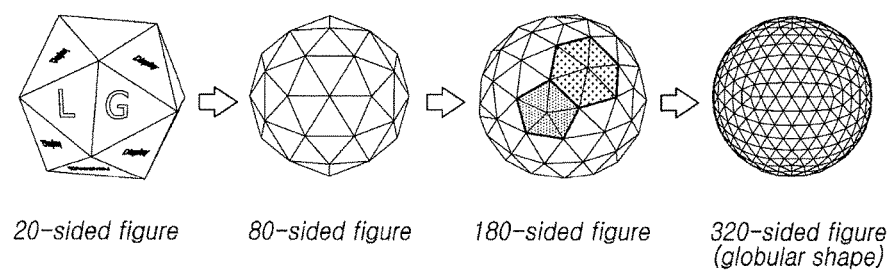
FIGS. 3A and 3B are three-dimensional views of the multiple-display device of FIG. 2, assembled into a polyhedron according to embodiments.

The multiple-display device 200 can be a three-or-more-sided polyhedron (e.g., a polyhedron with at least three triangular faces) to which two or more display devices 100 are assembled, as shown in FIG. 3A. The multiple-display device 200 can be a polyhedron, for example, a 20-sided figure, an 80-sided figure, a 180-sided figure, a 320-sided figure, or the like. As the number of sides or faces increases, the display device 200 can be provided in a globular shape.

Figure 3B:
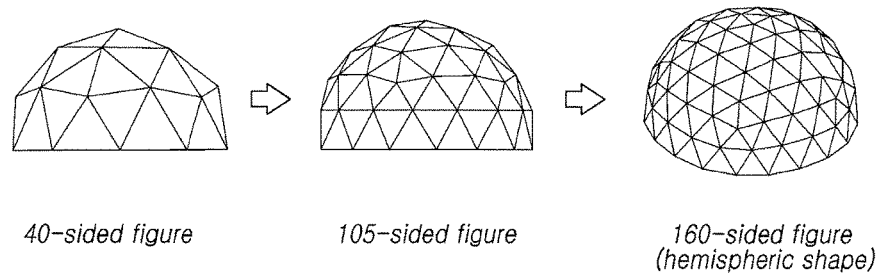

The multiple-display device 200 can be embodied as a polyhedron provided in a three-or-more-sided hemispherical shape or dome shape (e.g., a dome or half-dome with at least three triangular faces), to which two or more display devices 100 are assembled, as shown in FIG. 3B. The multiple-display device 200 can be embodied as a polyhedron provided in a hemispherical shape or a dome shape, for example, a 40-sided figure, a 105-sided figure, a 160-sided figure, or the like. As the number of sides or faces increases, the display device 200 can be provided in a hemispherical shape.

The display panel 110 of FIG. 1 has a triangular shape, and thus can have a high degree of freedom to form a polyhedron. Also, the display device 110 can control the display of an image in consideration of its expandability in the future. In the multiple-display device 200, each of the display devices 100 forming the polyhedron work together, and thus content can be displayed across the multiple faces of the polyhedron as a single image. Alternatively, each display device 100 can independently display an image.

Hereinafter, detailed examples of the unit display device 100 will be described with reference to drawings.

Figure 4:
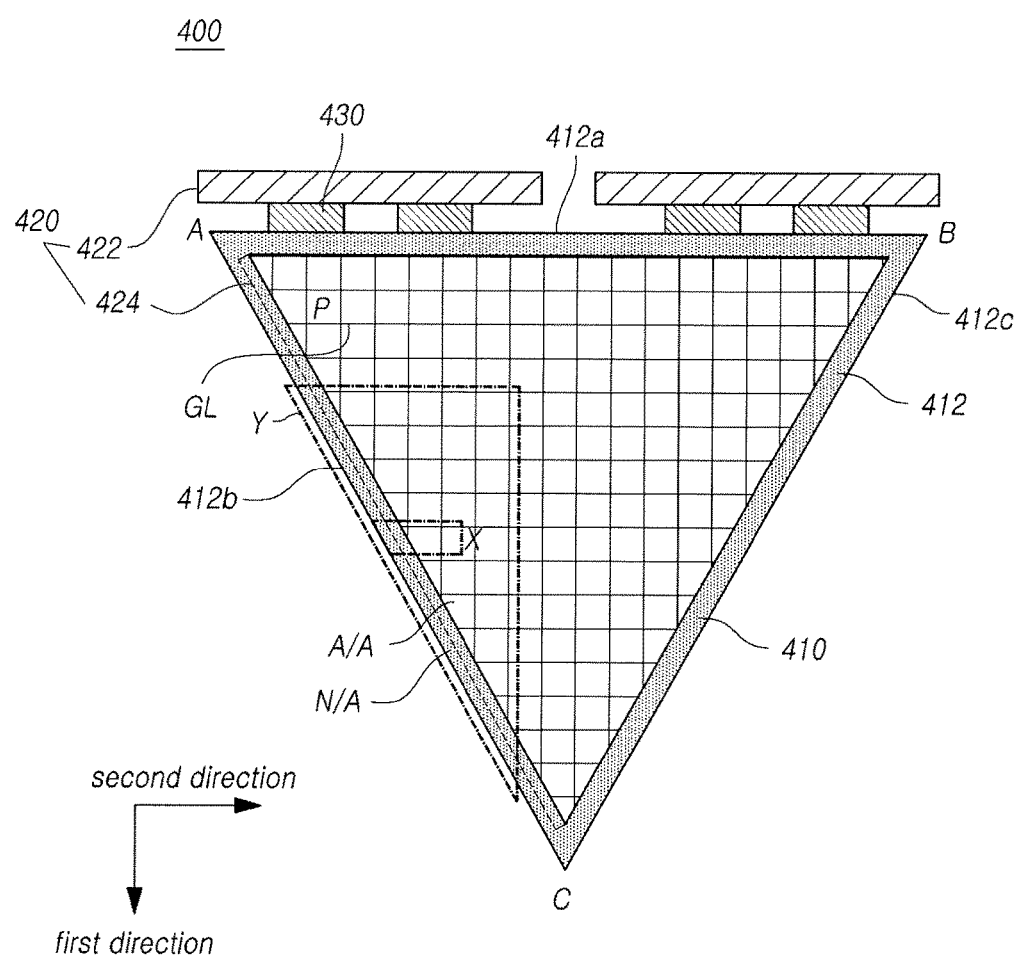
FIG. 4 is a plan view of a display device according to another embodiment.

FIG. 4 is a plan view of a display device according to an embodiment.

Referring to FIG. 4, a display device 400 according to an embodiment can include a display panel 410, a driving unit 420, and a connecting unit 430.

On the display panel 410, a plurality of data lines (DL) and a plurality of gate lines (GL) are disposed on a triangular-shaped board 412, and a plurality of pixels (P) is disposed in a matrix arrangement, and the plurality of pixels (P) is disposed in a triangular shape on the triangular-shaped board 412. The triangular-shaped board 412 includes three sides, which are a first side 412a, a second side 412b, and a third side 412c, and three vertices A, B, and C. The display panel 410 can be divided into a display area (A/A), in which an image is displayed, and a non-display area (N/A), in which an image is not displayed and on which various signal lines and elements associated with a driving unit 420 are disposed.

Each of the plurality of pixels (P) disposed on the display panel 410 according to the present embodiments can include a display element, such as an Organic Light-Emitting Diode (OLED) or a Liquid Crystal Cell, and a circuit element for driving the same, such as a Driving Transistor (DRT), a storage capacitor, or the like.

The types and numbers of circuit elements forming each pixel can be variously determined based on a function, a design scheme, or the like.

The driving unit 420 can include a data-driving unit 422, which supplies a data voltage to a plurality of data lines (DL) and drives the plurality of data lines, and a gate-driving unit 424, which sequentially supplies a gate signal to a plurality of gate lines and sequentially drives the plurality of gate lines.

The data-driving unit 422 is mounted on a data Tape Carrier Package (TCP) and is connected to the display panel 410 based on a Tape-Automated-Bonding (TAB) scheme, or can be mounted on the display panel 410 based on a Chip-On-Glass (COG) scheme. Hereinafter, it is described that the data-driving unit 422 receives control signals and driving voltages input from the outside through signal lines formed on a Printed Circuit Board (PCB) connected to the TCP, and is mutually connected to the signal lines.

The gate-driving unit 424 is connected with a bonding pad of the display panel 410 based on a Tape-Automated-Bonding (TAB) scheme or a Chip-On-Glass (COG) scheme, or can be directly disposed on the display panel 410 by being embodied as a Gate-In-Panel (GIP) type. In some situations, the gate-driving unit 424 can also be integrated on the display panel 410.

Hereinafter, it is described that the gate-driving unit 424 is directly disposed on the display panel 410 as a multiple-gate-in-panel type. The gate-driving unit 424 can sequentially supply a gate signal through a plurality of gate lines (GL) disposed on the display panel 410 from the plurality of gate-in-panels (GIPs).

The gate-driving unit 424 can supply a gate signal in a forward direction through a plurality of gate lines (GL), or can supply a gate signal in a reverse direction. In this example, the forward direction indicates the sequential supply of a gate signal from a gate line (GL) close to the first side 412a to a gate line (GL) that is far from the first side 412a, as illustrated in FIG. 2. The reverse direction indicates the sequential supply of a gate signal from a gate line (GL) that is far from the first side 412a to a gate line (GL) that is close to the first side 412a, as illustrated in FIG. 2.

Therefore, in the multiple-display device 200 including the display device 400 of FIG. 4 as a unit display device, two display devices 400, which are respectively disposed in a triangular shape and an inverted-triangular shape, sequentially supply gate signals in the reverse direction and the forward direction, respectively, and thus, overall, the multiple-display device 200 can sequentially supply a gate signal in a consistent direction. In the multiple-display device 200, the two display devices 400, which are respectively disposed in a triangular shape and an inverted triangular shape, sequentially supply a gate signal in the same direction, that is, the reverse direction or the forward direction. Therefore, the multiple-display device 200 can sequentially supply a gate signal in a different direction for each unit display device 400.

A plurality of data lines (DL) can be disposed in a first direction from the first side 412a of the triangular-shaped board 412. In other words, the plurality of data lines (DL) can be disposed in the first direction from the first side 412a of the triangular-shaped board 412 toward the second side 412b and the third side 412c of the board 412. In this instance, the length of each of the plurality of data lines (DL) can increase and then decrease from one end (A) to the other end (B) of the first side 412a of the board 412. In other words, the plurality of data lines (DL) can have the greatest length at the center of the board 412, and can have the smallest length at both edges (e.g., near the corners of the triangular shaped board). Accordingly, the length of each of the lines decreases sequentially from the center to both edges.

The plurality of gate lines (GL) is disposed in a second direction between the second side 412b and the third side 412c of the triangular-shaped board 412, and the lengths of the gate lines (GL) sequentially decrease from one end (A) to the other end (C) along the second side 412b of the board 412.

As illustrated in FIG. 4, pixels (P) are disposed at intersections where the plurality of data lines (DL) in the first direction and the plurality of gate lines (GL) in the second direction intersect. Pixels disposed on the first side 412a of the board 412 where the data-driving unit 422 is disposed, and disposed on the display area (A/A) of the display panel 410, can be disposed parallel to the data-driving unit 422. In proportion to the length of a gate line, which sequentially decreases from one end (A) to the other end (C) of the second side 412b of the board 412, the number of pixels (P) disposed on the display area (A/A) can decrease as pixels are disposed further away from the data-driving unit 422.

A plurality of data lines (DL) and a plurality of gate lines (GL) intersect and form a triangular-shaped matrix, and pixels (P) are disposed at intersections where the plurality of data lines (DL) and the plurality of gate lines (GL) intersect, and thus the plurality of pixels (P) can be disposed in a triangular shape on the triangular-shaped board 412. When the plurality of pixels is disposed in a triangular shape on the triangular-shaped board 412, this may not indicate that the pixels form a mathematically perfect triangle, but can indicate that the overall shape is a triangular shape.

Also, a gate-in-panel is disposed to correspond to a step which is generated when the number of pixels connected to each of the plurality of gate lines is decreased, and thus the area of a non-light-emitting area of an edge of the triangular-shaped board can be reduced. Therefore, the size of the bezel of the triangular-shaped board can be reduced. Here, although it is illustrated that the board is provided in a triangular shape, this is not limiting.

Figure 5A:
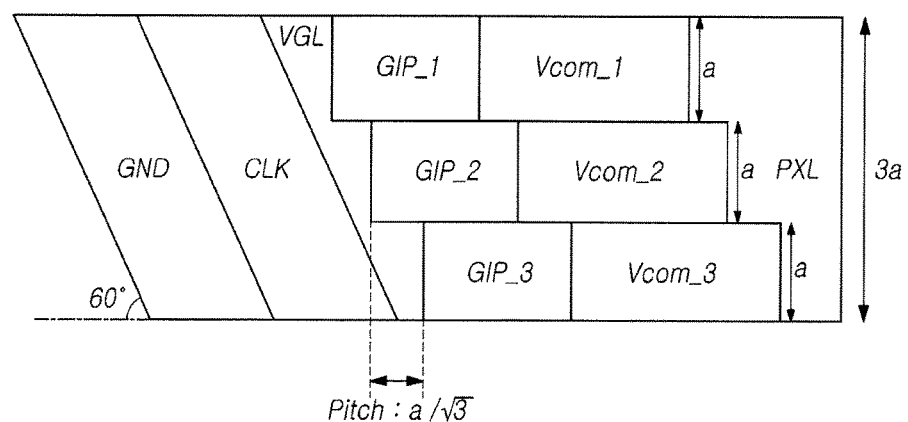
FIG. 5A is a detailed view of a part (X) of FIG. 4, which illustrates the disposition of a gate-driving unit and various wiring located in a non-display area of a board according to an embodiment.
Figure 5B:
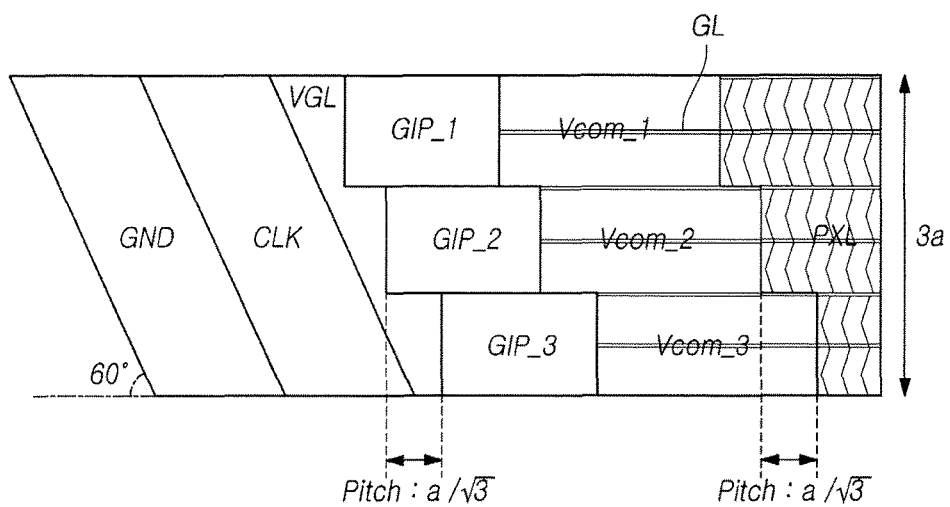
FIG. 5B is a diagram illustrating the disposition of gate-in-panels (GIPs) and pixels of FIG. 5A according to an embodiment.

FIG. 5A is a detailed view of a part (X) of FIG. 4 which illustrates the disposition of a gate-driving unit and various wiring located in a non-display area of a board. FIG. 5B is a diagram illustrating the disposition of gate-in-panels and pixels of FIG. 5A.

Referring to FIGS. 5A and 5B, the gate-driving unit 424 can include a plurality of gate-in-panels (GIPs) disposed in a non-display area (N/A) of the display panel 410. The plurality of gate-in-panels can be disposed in the non-display area (N/A) to be parallel to one of the second side 412b and the third side 412c of the board 412.

The plurality of gate-in-panels can be disposed in the non-display area (N/A) in the second side 412b and the third side 412c of the board 412 to be parallel to the second side 412b and the third side 412c. In other words, gate-in-panels are disposed on both sides of each gate line (GL), and one or both of the gate-in-panels of both sides can supply a gate signal through a gate line (GL).

A ground wiring (GND), a clock wiring (CLK), and a gate voltage supply line (VGL) can be disposed between the plurality of gate-in-panels and the second sides 412b, and a common wiring (VCOM) can be disposed between the gate-in-panels and the pixels of a display area (A/A). However, the disposition of the wiring can be variously changed. The ground wiring (GND), the clock wiring (CLK), and the common wiring (VCOM) can also be disposed in an oblique line or diagonal line in the same manner as the plurality of gate-in-panels. The oblique disposition of the ground wiring (GND), the clock wiring (CLK), the gate voltage supply line (VGL), the common wiring (VCOM), and the plurality of gate-in-panels (GIP) can be determined based on a triangular shape of the board 412. For example, when the board 412 is a regular triangular shape, the oblique line of the ground wiring (GND), the clock wiring (CLK), the gate voltage supply line (VGL), the common wiring (VCOM), and the plurality of gate-in-panels (GIP) can be parallel to the second side 412b or the third side 412c of the board 412.

When the height of a gate-in-panel (GIP) is "a" and the board 412 is provided in a regular triangular shape, each of the plurality of gate-in-panels (GIP) can be disposed from one end (A) to the other end (C) of the second side 412b of the board 412 based on a pitch of a/b (where a and b are real numbers greater than 0) in an oblique line inside the second side 412b of the board 412. When the plurality of gate-in-panels (GIP) is disposed parallel to the third side 412c of the board 412, each of the plurality of gate-in-panels (GIP) can be disposed from one end (B) to the other end (C) of the third side 412c of the board 412 based on a pitch of a/b in an oblique line inside the third side 412c of the board 412. In this instance, b can be determined based on the triangular shape of the board 412.

For example, when the board 412 is a regular triangular shape, and the ground wiring (GND), the clock wiring (CLK), the common wiring (VCOM), and the plurality of gate-in-panels (GIP) is disposed in an oblique line having an angle of 60 degrees from the first side 412a, each of the plurality of gate-in-panels (GIP) can be disposed from one end (B) to the other end (C) of the third side 412c of the board 412 based on, for example, a pitch of a/$\sqrt{3}$, in an oblique line inside the third side 412c of the board 412. However, this is not limiting.

As illustrated in FIG. 5B, a gate signal can be supplied to two pixels (P) located at both sides of each gate line at the same time using the single gate line (GL). In this instance, "a", the height of a gate-in-panel (GIP), can be the same or substantially the same as the width of two pixels located at both sides of each gate line. When a gate signal is supplied to a single pixel (P) by using a single gate line, "a", the height of a gate-in-panel (GIP) can be the same or substantially the same as the width of a single pixel.

When a gate signal is supplied to two pixels (P) located at both sides of each gate line using a single gate line, three pixels in a second direction, that is, 2*3 pixels (a total of 6 pixels) can be disposed inside the board 412 in an oblique line based on a pitch, which is the same as that of each of the above-described gate-in-panels (GIP). Alternatively, the pixels can be disposed inside the board 412 in an oblique line based on a different pitch.

Figure 6:
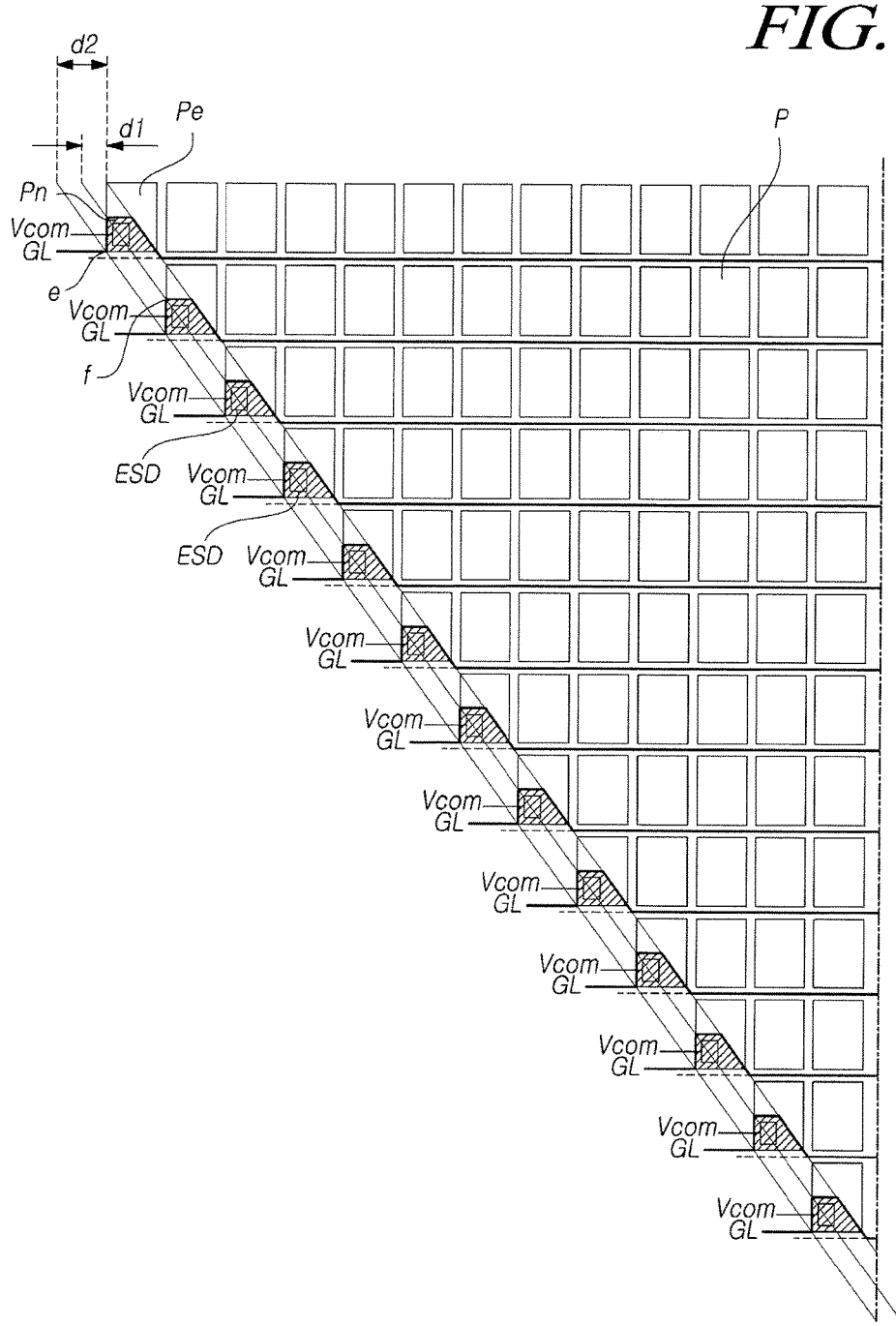
FIG. 6 is a detailed view of a part (Y) of FIG. 4, which illustrates the disposition of pixels and gate lines located on a second side of a board according to an embodiment.

FIG. 6 is a detailed view of a part (Y) of FIG. 4, which illustrates the disposition of pixels and gate lines located on a second side of a board.

Referring to FIG. 6, on the triangular-shaped board 410, a plurality of pixels (P) can be disposed to correspond to a second side formed in an oblique line, based on the shape of the board, and outermost pixels that are in contact with the second side can be disposed to have steps. The step indicates a difference in the lengths between a pixel row of pixels connected to the same gate line and another pixel row adjacent to the pixel row on the board. Also, although it is illustrated that the step is formed by a single pixel, this is not limiting, and the step may be formed by one or more pixels based on the number of pixels connected to each gate line. Also, each gate line can be configured to be curved at a part where a pixel that is in contact with the second side is located, in a direction in which the area of a light-emitting unit (Pe) of the pixel decreases. Accordingly, an area in the lower portion of a gate line out of the area of a pixel (P) does not emit light, and an area in the upper portion of the gate line can emit light. In other words, a pixel (P) can include a light-emitting unit (Pe) and a non-light-emitting unit (Pn), and the area of the non-light-emitting unit (Pn) of the pixel (P) can be increased as a gate line (GL) is bent.

When a gate line (GL) is not bent but is disposed as shown by the broken line, the light-emitting area (Pe) of an outermost pixel is further extended to a vertex (e) of the rectangular-shaped pixel. To shade the step shown by the pixel, a part (d2) from the vertex (e) of the pixel to a diagonal line needs to be shaded. Accordingly, the second side can be shown as a straight line. However, when the gate line (GL) is bent, the size of the non-light-emitting area (Pn) of the pixel becomes larger. Accordingly, the second side can be shown as a straight line only when a part from a point (f) of intersection of one side and the gate line (GL) to a diagonal line of the pixel is shaded.

Therefore, the thickness of a bezel part at the second side of the triangular-shaped board can be made thinner. Also, the bezel can made thinner by inserting an element for driving into a non-light-emitting area of a pixel that becomes larger due to the bending of the gate line. The element that can be inserted into the non-light-emitting area can be an electrostatic discharge (ESD) element. The ESD element can be connected with a common wiring (Vcom) disposed outside the second line of the triangular-shaped board. Also, the ESD can be connected with a common wiring (Vcom) and a data line in a lower portion of the pixel. However, the element inserted into the non-light-emitting area (Pn) is not limited thereto. Also, the ESD element does not have to be formed only in a part where the ESD is connected with a common wiring (Vcom) and a data line, and can be connected with a gate line. When the ESD element is disposed in the non-light-emitting area (Pn) of the pixel, the thickness of the non-light-emitting area (N/A) of FIG. 4 can be made thinner, and a thinner bezel can be provided. Also, although it is illustrated that the light-emitting area (Pe) of the pixel is in a rectangular shape, this is not limiting. Also, although only the second side of the triangular-shaped board has been described, the description can be equally applied to the third side of the triangular-shaped board.

Figure 7A:
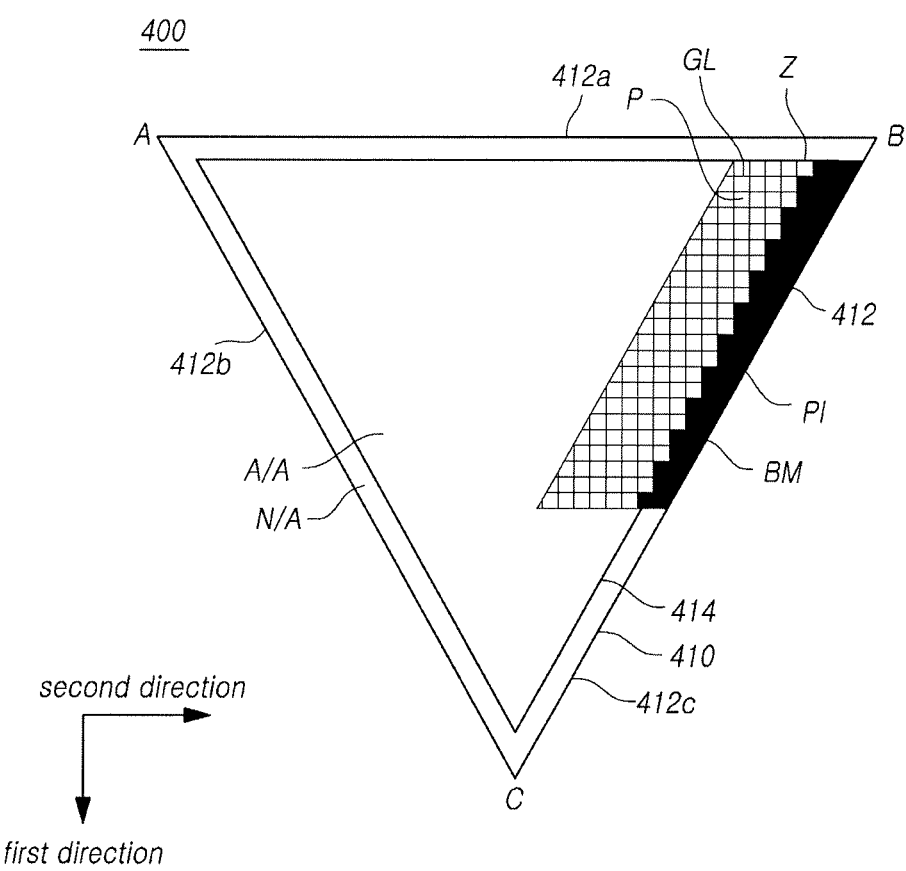
FIGS. 7A through 7C are plan views illustrating an example of the disposition of a black matrix included in a liquid crystal display device when the display device of FIG. 4 is a liquid crystal display device according to an embodiment.
Figure 7B:
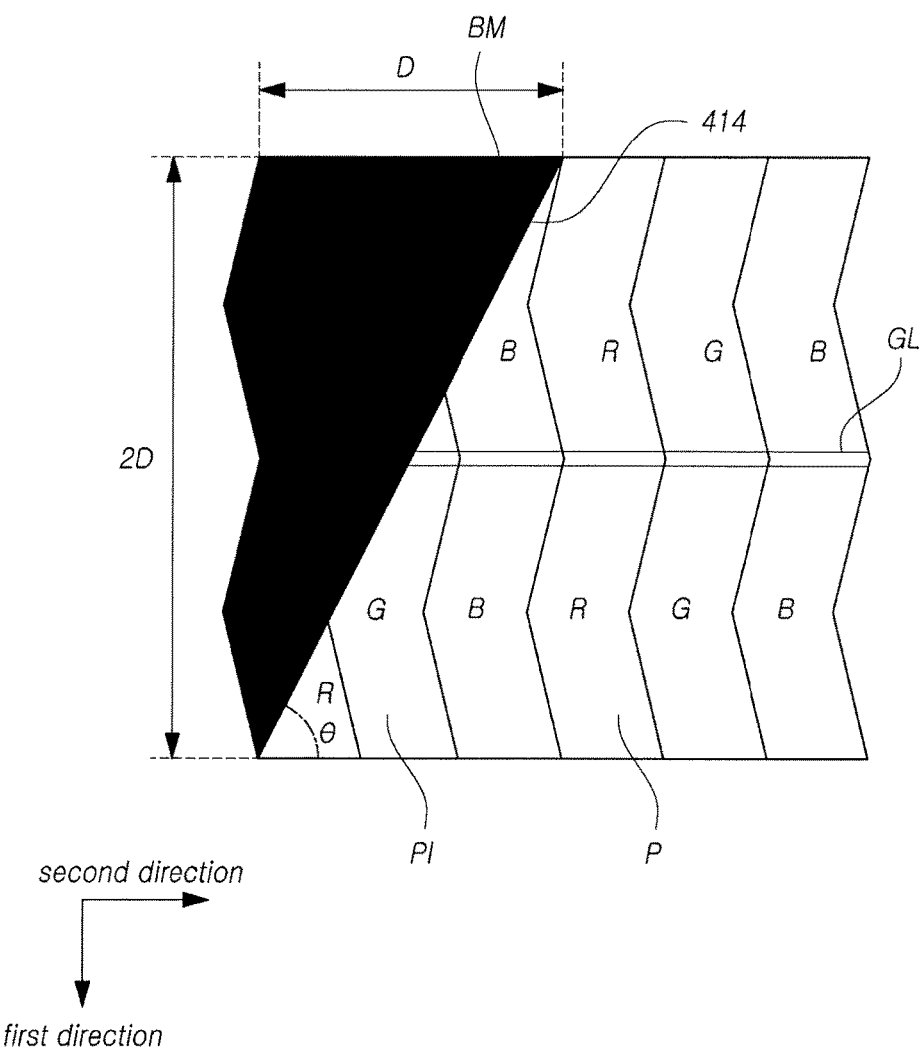

FIGS. 7A and 7B are plan views illustrating the disposition of a black matrix included in a liquid crystal display device when the display device of FIG. 4 is a liquid crystal display device. FIG. 7A illustrates only the part (Y) of the display area and the non-display area.

Referring to FIG. 7A, when the display device 400, which has been described with reference to FIG. 4, is a liquid crystal display device, the display device 400 additionally includes a black matrix (BM), which is disposed in a driving area where a thin film transistor (TFT) is disposed that drives a data line (DL), a gate line (GL), and a pixel (P) in a non-display area (N/A) and a display area (A/A), in another board that is disposed to face the board 410. The black matrix (BM) can shade the driving area of the non-display area (N/A) and the display area (A/A).

As described above, in association with each of the pixels (PI) located in a boundary 414 between the triangular-shaped display area (A/A) and non-display area (N/A) out of a plurality of pixels (P) disposed at intersections where a plurality of data lines (DL) in a first direction and a plurality of gate lines (GL) in a second direction intersect, a part of each pixel can be located in the display area (A/A) and the other part can be located in the non-display area (N/A). Particularly, when the pixels (PI) located in the boundary 414 between the display area (A/A) and the non-display area (N/A) and pixels (P) located in the display area (A/A) have the same pixel structure, some pixels (PI) can be divided by the boundary 414 of the display area (A/A) and the non-display area (N/A).

As illustrated in FIG. 7A, the black matrix (BM) can have a structure that shades all of the pixels (PI) located in the boundary 414. In this instance, the outline of the black matrix (BM) can be disposed along the shape of the display area (A/A) of pixels (PI) that are divided by the boundary 414.

As illustrated in FIG. 7B, in the boundary 414 between the display area (A/A) and the non-display area (N/A), the black matrix (BM) can be located from the non-display area (N/A) to the boundary 414 of the display area (A/A) and the non-display area (N/A). In this instance, although the pixels (PI) located in the boundary 414 are divided by the boundary 414 of the display area (A/A) and the non-display area (N/A), the black matrix (BM) can have a structure that shades only the non-display-area (N/A)-side part of the pixels (PI) located at the boundary 414.

In other words, two or more outermost pixels (PI) located close to the second side 412b of the board 412 from among a plurality of pixels (P) can be disposed in an oblique line inside the second side 412b of the board 412. Also, two or more outermost pixels (PI) located close to the third side 412c of the board 412 from among the plurality of pixels (P) can be disposed in an oblique line inside the third side 412c of the board 412.

In this instance, the black matrix (BM) can shade a part of each of the outermost pixels (PI) of the second side 412b and the third side 412c of the board 412 in an oblique line. Therefore, the boundary 414 that distinguishes the display area (A/A) and the non-display area (N/A) can be identical to the oblique line of the black matrix (BM). Hereinafter, it is described that the boundary 414 that distinguishes the display area (A/A) and the non-display area (N/A) is the same as the oblique line of the black matrix (BM), but the boundary 414 and the oblique line of the black matrix (BM) can be different from each other.

Figure 7C:
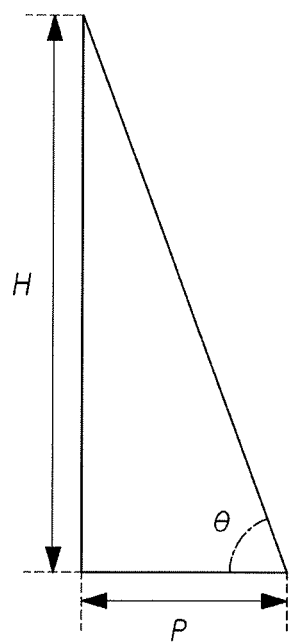

As illustrated in FIG. 7C, it is assumed that the width of the three pixels (P) in the first direction is P and the height of two pixels (P) located on both sides of a gate line in the second direction is H. In this instance, the angle θ of the oblique line of a black matrix (BM) that shades a part of each of the pixels (PI) can be an inverse-tangent value (H/P) based on the first side 412a. When the width P of the three pixels (P) in the first direction is D, the height H of two pixels (P) located on both sides of a gate line in the second direction can be less than or equal to 2D. Therefore, the angle θ of the oblique line of a black matrix (BM) that shades a part of each of the pixels (PI) is an inverse-tangent value (H/P) based on the first side 412a, and thus, it can be less than or equal to 63.4. For example, when the board 412 is provided in a regular triangular shape, the angle θ of the oblique line of the black matrix (BM) can be 60 degrees based on the first side 412a of the board 412, but this is not limiting.

As described above, since the black matrix (BM) is disposed in an oblique line, a step pattern may not be recognized from the boundary 414 of the display area (A/A) and the non-display area (N/A) (e.g., the black matric can hide the stepped pattern of the pixels to provide a clean diagonal edge).

Figure 8A:
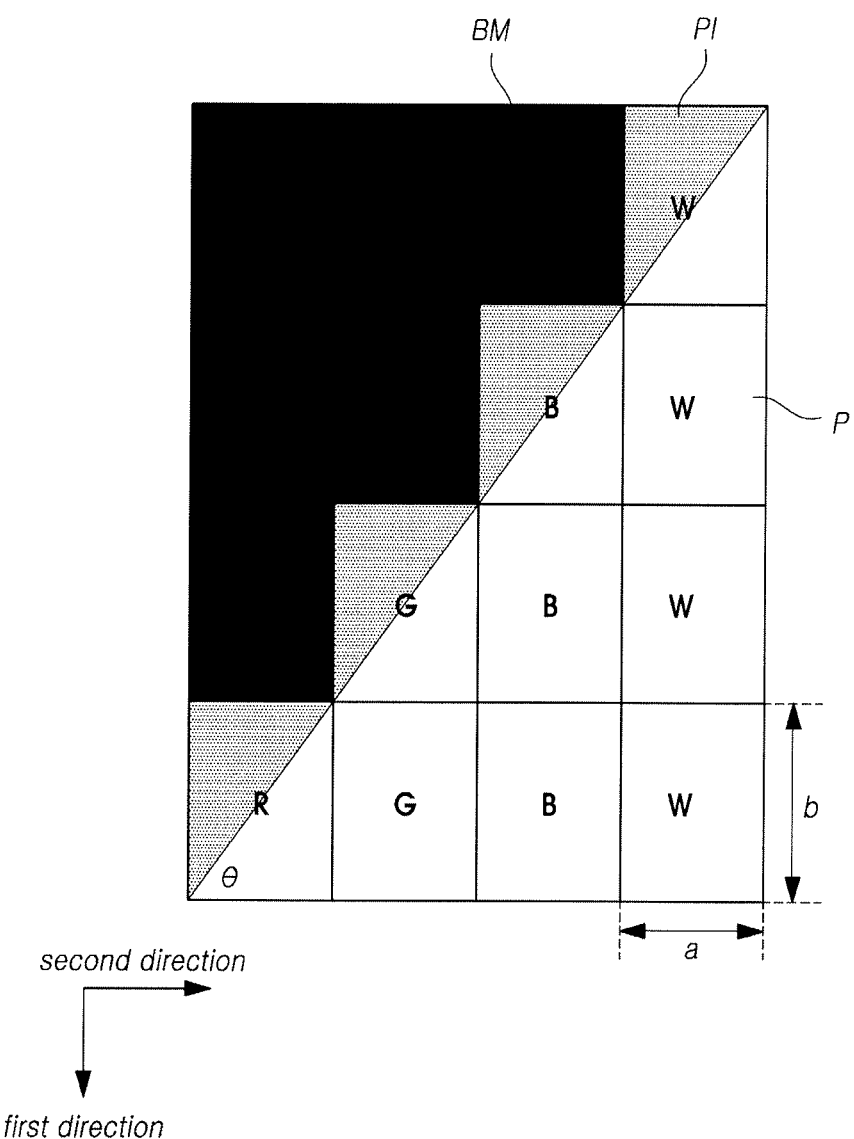
FIGS. 8A and 8B are plan views illustrating another example of the disposition of a black matrix included in a liquid crystal display device when the display device of FIG. 4 is a liquid crystal display device according to an embodiment.
Figure 8B:
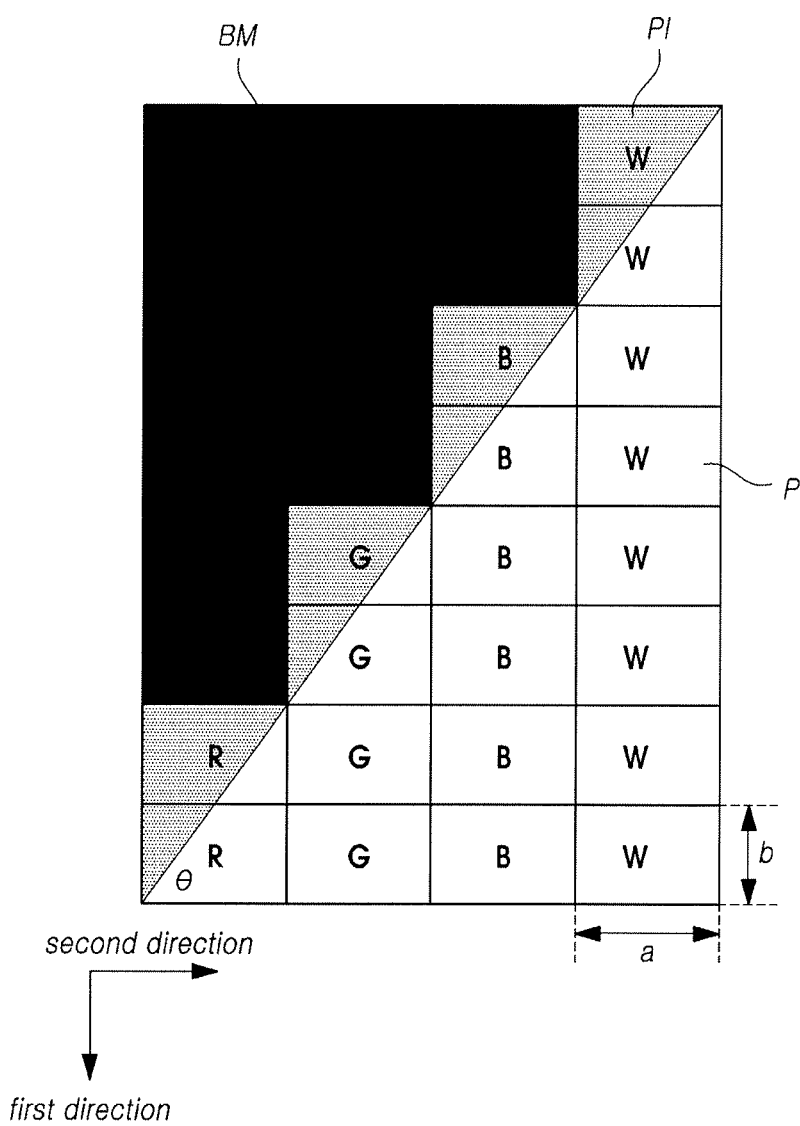

FIGS. 8A and 8B are plan views illustrating another example of the disposition of a black matrix included in a liquid crystal display device when the display device of FIG. 4 is a liquid crystal display device.

Referring to FIGS. 8A and 8B, in pixels (PI) located at the boundary 414, the oblique line of a black matrix (BM), that is, the boundary 414 of the display area (A/A) and the non-display area (N/A), can be parallel to a diagonal line that connects the vertices of one, or two or more, outermost pixels (PI) of the second side 412b and the third side 412c of the board 412.

For example, as illustrated in FIG. 8A, the oblique line of the black matrix (BM) can be parallel to a diagonal line that connects the vertices of one outermost pixel (PI) of the second side 412b and the third side 412c of the board 414. For example, the oblique line of the black matrix (BM) can be the same as a diagonal line that connects the vertices of one outermost pixel (PI) of the second side 412b and the third side 412c of the board 412. Therefore, the black matrix (BM) can shade a half of one outermost pixel (PI) of the second side 412b and the third side 412c of the board 412.

As another example, as illustrated in FIG. 8B, the oblique line of the black matrix (BM) can be parallel to a diagonal line that connects the vertices of two outermost pixels (PI) of the second side 412b and the third side 412c of the board 412. For example, the oblique line of the black matrix (BM) can be the same as a diagonal line that connects the vertices of two outermost pixels (PI) of the second side 412b and the third side 412c of the board 412. Therefore, the black matrix (BM) can shade half of the two outermost pixels (PI) of the second side 412b and the third side 412c of the board 412.

In the above-described examples, although it is described that the oblique line of the black matrix (BM) is parallel to a diagonal line that connects the vertices of one or two outermost pixels (PI) of the second side 412b and the third side 412c of the board 412, the oblique line can be parallel to a diagonal line that connects the vertices of three or more outermost pixels (PI) of the second side 412b and the third side 412c of the board 412. In the same manner, the oblique line of the black matrix (BM) can be the same as a diagonal line that connects the vertices of three or more outermost pixels (PI) of the second side 412b and the third side 412c of the board 412. Therefore, the black matrix (BM) can shade half of the three or more outermost pixels (PI) of the second side 412b and the third side 412c of the board 412.

As illustrated in FIGS. 8A and 8B, when the oblique line of the black matrix (BM) passes through the vertices of the pixels (P) and the board 412 is provided in a triangular shape, the ratio of the width to the height of a pixel (P) can be defined to have a predetermined value. In other words, the ratio of the width to the height of the pixel (P) can be determined based on a triangular shape. For example, when the board 412 is provided in a regular triangular shape, the ratio of the length (b) in a second direction to the length (a) in a first direction of each of the outermost pixels (P) of the second side 412b and the third side 412c can be 1: $\sqrt{3}$/n (where n is the minimum number of outermost pixels having vertices that the oblique line of the black matrix (BM) passes through).

For example, when the minimum number of outermost pixels having vertices that the oblique line of the black matrix (BM) passes the vertices of the outermost pixels is one as illustrated in FIG. 8A, n=1, and when the minimum number of outermost pixels having vertices that the oblique line of the black matrix (BM) passes is two as illustrated in FIG. 7A, n=2.

As described above, since the angle of the oblique line of the black matrix (BM) is controlled, a step pattern may not be recognized from the boundary 414 of the display area (A/A) and the non-display area (N/A).

Figure 9:
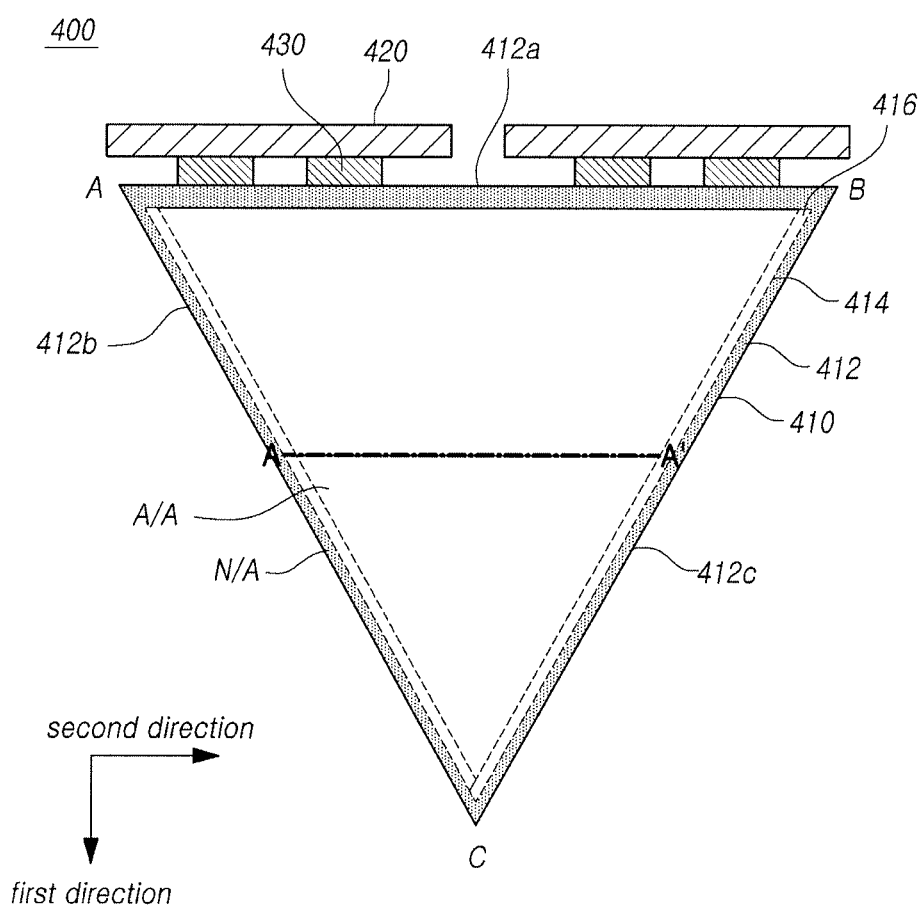
FIG. 9 illustrates image processing of pixels in an oblique line part located in a boundary area between a display area (A/A) and a non-display area (N/A) according to an embodiment.
Figure 10:
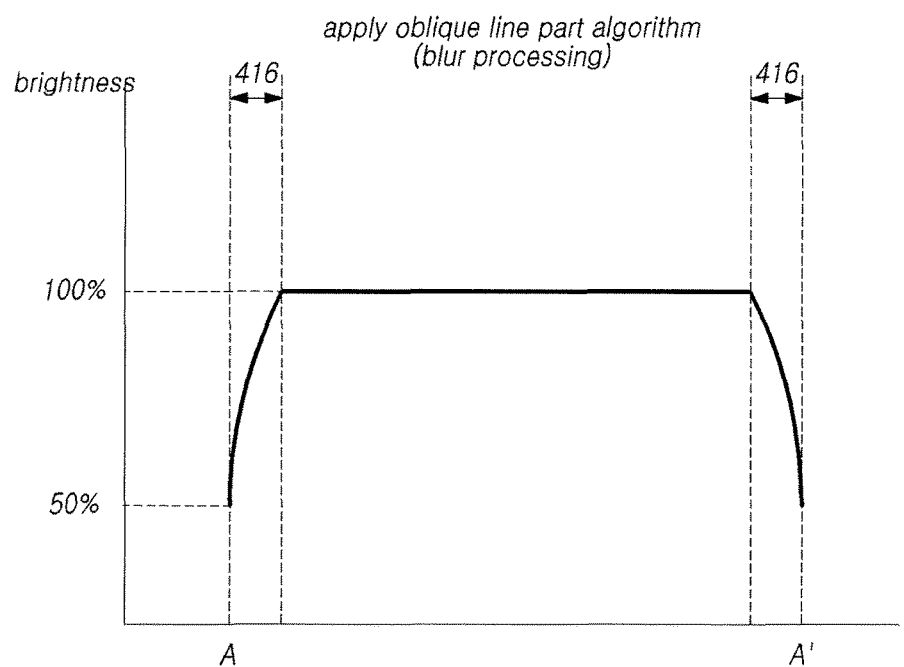
FIG. 10 illustrates the relative brightness of pixels in a central part and an oblique line part according to an embodiment.

FIG. 9 illustrates that image processing is performed, in which the pixels (P) of a boundary part 416 located in the display area (A/A) of the display panel 410 and in the boundary area of the display area (A/A) and the non-display area (N/A) are blurred, whereby the step pattern in the boundary 414 of the display area (A/A) and the non-display area (N/A) can be hidden. For example, as illustrated in FIG. 10, the pixels (P) of the boundary part 416 can have a relatively low brightness.

Particularly, the brightness of the pixels (P) located in the boundary part 416 of the second side 412b and the third side 412c of the board 412 can be relatively lower than the brightness of the pixels (P) located in the central part. For example, the brightness of the pixels (P) located in the boundary part 416 of the second side 412b and the third side 412c of the board 412 can decrease gradually or in stages as the location of a pixel (P) becomes close to the outermost side. For example, when the brightness of the pixels (P) located in the center is 100%, the brightness of the pixels (P) located in the boundary part 416 of the second side 412b and the third side 412c of the board 412 can be, for example, 50%. However, this is not limiting, and the brightness can have any value, provided that the value is less than 100%.

In this instance, a reduction rate that decreases the brightness or the number of pixels (P) disposed in the boundary part 416 and the brightness of an outermost pixel can be selected appropriately for the environment of the display device 400, which may vary.

Figure 11:
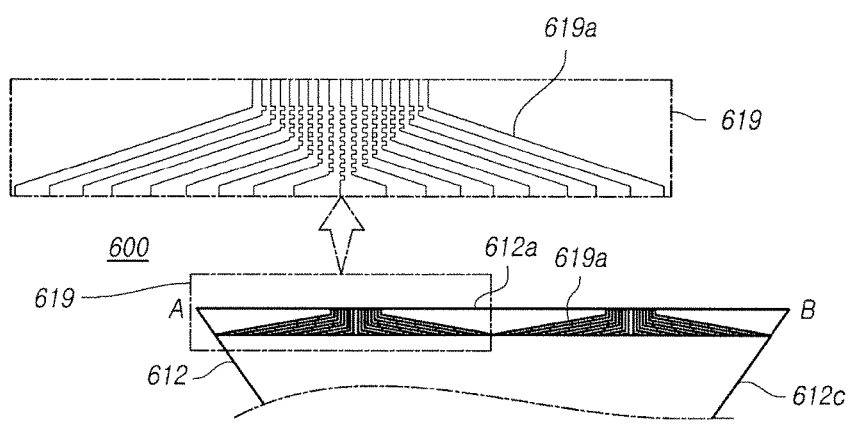
FIG. 11 is a plan view of a part of a display panel of a display device according to another embodiment.

FIG. 11 is a plan view of a part of a display panel of a display device according to an embodiment.

Referring to FIG. 11, a display panel of a display device 600 according to an embodiment can further include a data pad unit including a plurality of data pads disposed on a non-display area (N/A) in the first side 612a direction of a triangular-shaped board 612, and a data link line unit 619 including a plurality of data link lines 619a which connect the data pad unit and data lines (DL). The first side 612a and the third side 612c share a corner (B). In this instance, the lengths of a plurality of data link lines 619a included in the data link line unit 619 can be the same as one another.

Among the plurality of data link lines 619a included in the data link line unit 619, data link lines 619a disposed in the center can be disposed in the non-display area (N/A) of the display panel 610, and can be partially provided in a zigzag pattern. Therefore, the length of a data link line 619a from a data pad to a data line (DL) in the center or the length of a data link line 619a from a data pad to a data line (DL) in an edge can be the same (e.g., in order to equalize the timing or line resistance when supplying data signals on the data link lines 619a).

The lengths of a plurality of data lines (DL) disposed on the triangular-shaped board 612 become shorter from the center to an edge, and thus, the total length of a data line (DL) and a data link line 619a in the center can be shorter than the length at the edge. Accordingly, the line resistance of a data line (DL) located in the center may be higher than that of a data line (DL) located at the edge.

Figure 12:
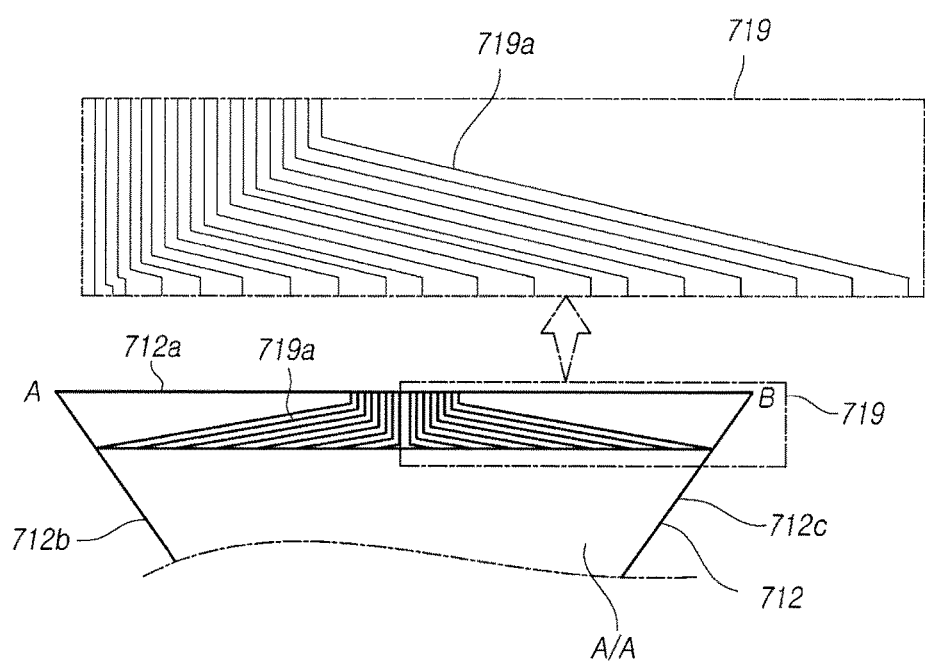
FIG. 12 is a plan view of a part of a display panel of a display device according to another embodiment.

FIG. 12 is a plan view of a part of a display panel of a display device according to another embodiment.

Referring to FIG. 12, a display panel of a display device according to an embodiment can further include a data pad unit including a plurality of data pads disposed on a non-display area (N/A) in the first side 712a direction of the triangular-shaped board 712, and a data link line unit 719 including a plurality of data link lines 719a which connect the data pad unit and data lines (DL). In this instance, the lengths of the plurality of data link lines 719a included in the data link line unit 719 can decrease and then increase from one end (A) to the other end (B) of the first side 712a of the triangular-shaped board 712. In other words, the length of a data link line 719a at an edge is longer than the length in the center.

The length of each of a plurality of data lines (DL) disposed on the triangular-shaped board 712 sequentially increases from the center to an edge, and thus, the total length of a data line (DL) and a data link line 719a can be the same. Accordingly, the line resistance of a data line (DL) located in the center and that of one at the edge can be the same in a display area (A/A).

Figure 13:
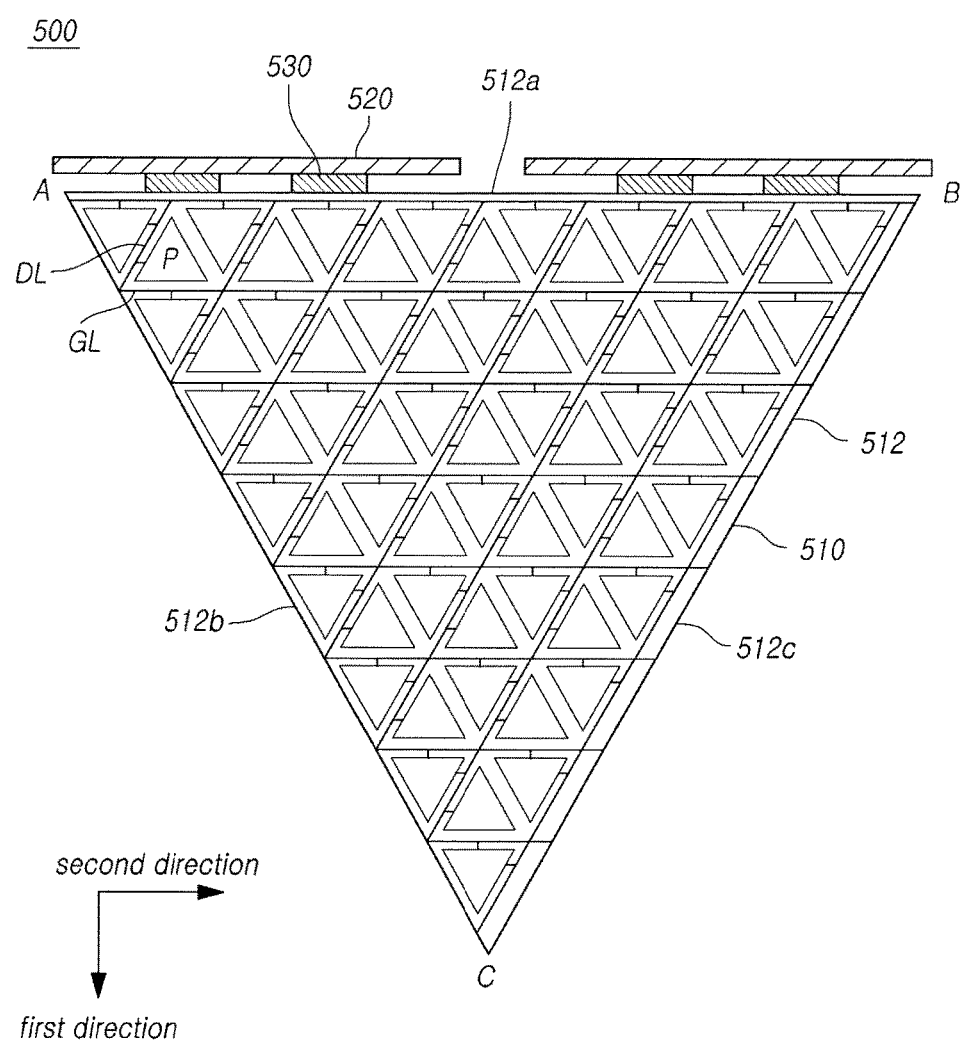
FIG. 13 is a plan view of a display device according to another embodiment.
Figure 14:
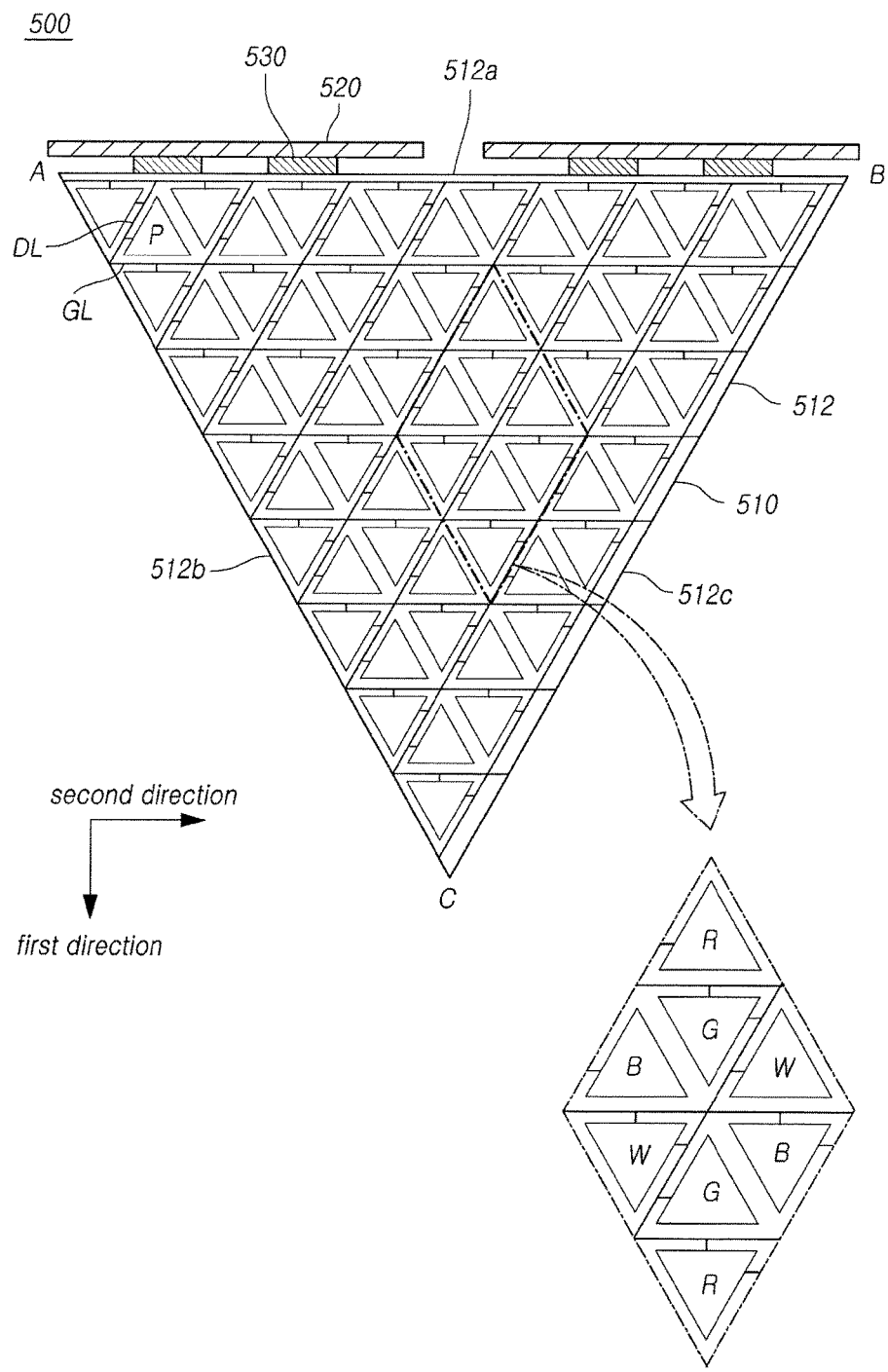
FIG. 14 is a plan view of a display device according to another embodiment.

FIGS. 13 and 14 are plan views of a display device according to another embodiment.

Referring to FIG. 13, a display device 500 according to another embodiment can include a display panel 510, a driving unit 520, and a connecting unit 530. In this instance, the shape of each of a plurality of pixels (P) respectively disposed at intersections where data lines (DL) and gate lines (GL) intersect in the display panel 510 can be a triangular shape.

In this instance, two adjacent pixels provided in a second direction are disposed in a triangular shape and an inverted-triangular shape, respectively, such that they are disposed close to each other in a parallelogram shape. Therefore, a visible step at the boundary of a display area and a non-display area does not exist.

In this instance, the data lines (DL) can be disposed in an oblique line from the first direction, and the gate lines (GL) can be disposed parallel to the second direction.

Each of the plurality of triangular-shaped pixels (P) cam be similar to the triangular shape of the board 512, but may not be limited thereto. For example, when the board 512 has a regular triangular shape, each of the plurality of pixels (P) can also be provided in a regular triangular shape. The triangular-shaped board 512 includes three sides, which are a first side 512a, a second side 512b, and a third side 512c, and three vertices A, B, and C.

As illustrated in FIG. 14, a plurality of pixels (P) can be disposed in a manner in which three pixels (P) provided in the second direction and one adjacent pixel (P) provided in the first direction are repeatedly disposed so that the four pixels form a triangular shape. The four pixels repeatedly disposed in the triangular shape can be red (R), blue (B), green (G), and white (W) pixels. Through the above, the red (R), blue (B), green (G), and white (W) pixels can express a color.

Figure 15:
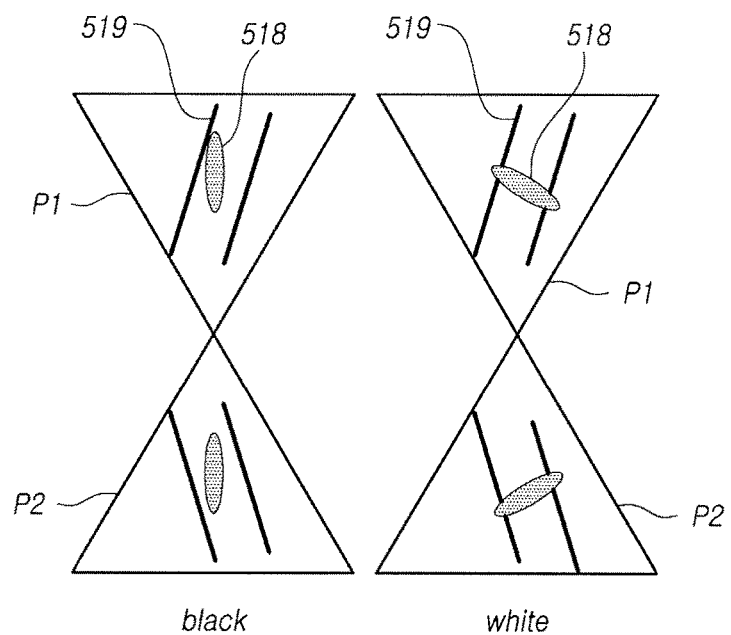
FIG. 15 is a conceptual diagram illustrating an alignment layer of each pixel included in a liquid crystal display device and the direction of a liquid crystal during driving when the display device of FIG. 13 is a liquid crystal display device according to an embodiment.

FIG. 15 illustrates an alignment layer of each pixel (P1 and P2) included in a liquid crystal display device and the direction of a liquid crystal during driving, when the display device of FIG. 13 is a liquid crystal display device.

Referring to FIG. 15, when the display device of FIG. 13 is a liquid crystal display device, and two adjacent pixels (P1 and P2) provided in a second direction are liquid crystal cells, the alignment layers 519 of the two liquid crystal cells (P1 and P2) can be oriented in different directions. Accordingly, during driving, the liquid crystals 518 of the two liquid crystal cells (P1 and P2) can rotate in different directions from each other and operate as different domains.

Figure 16:
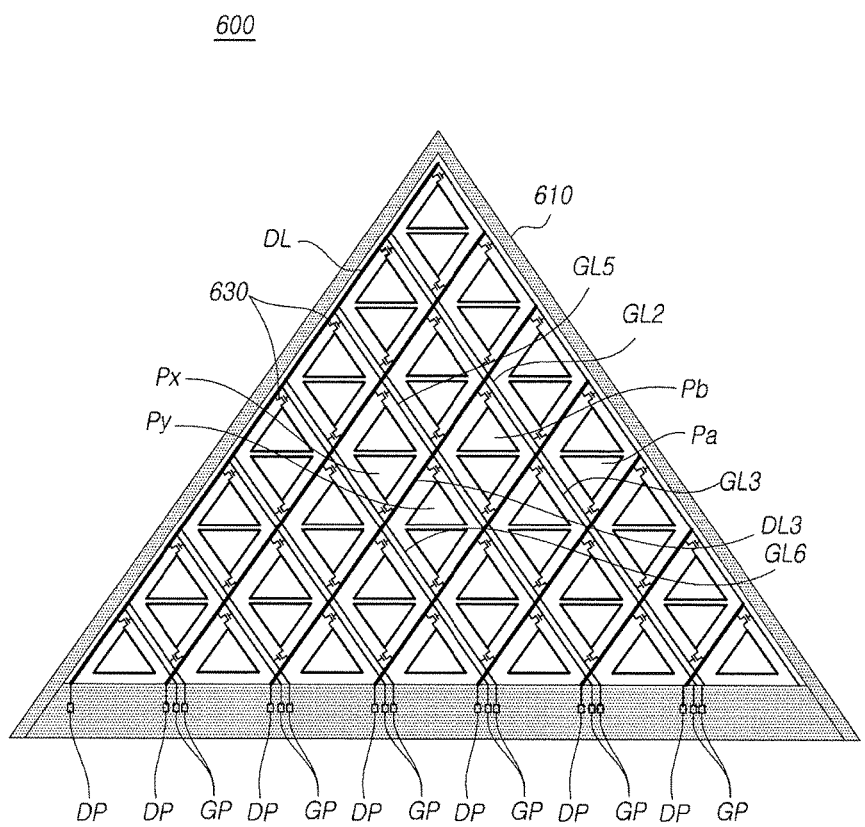
FIG. 16 is a plan view of a triangular-shaped board according to an embodiment.
Figure 17:
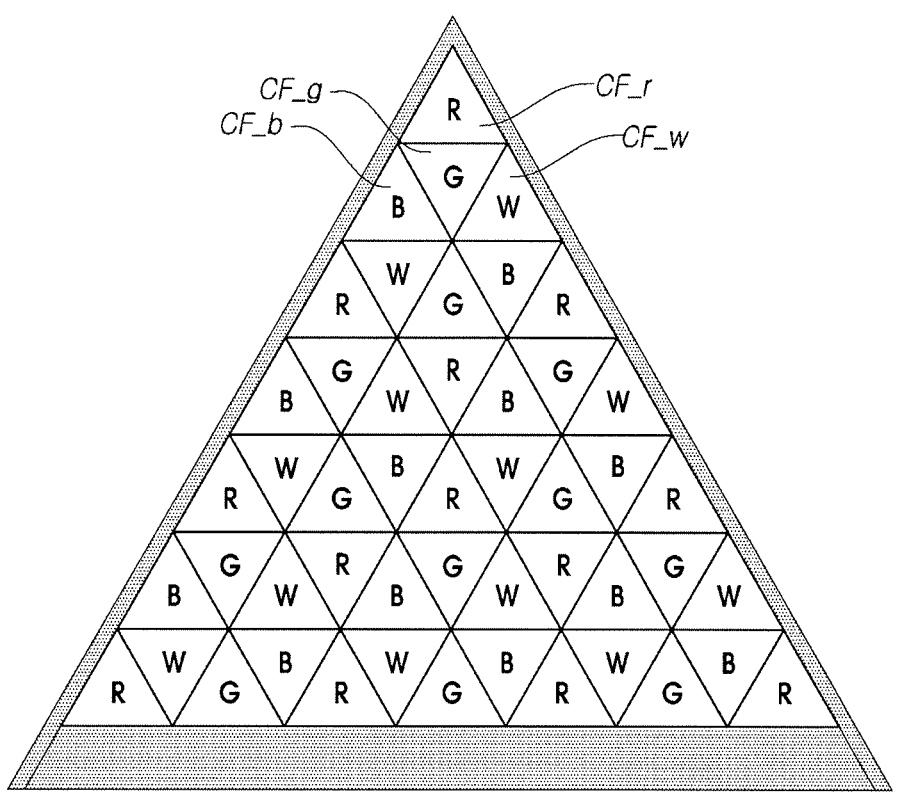
FIG. 17 is a plan view of a color filter disposed on a triangular-shaped board according to an embodiment.

FIG. 16 is a plan view of a triangular-shaped board, and FIG. 17 is a plan view of a color filter disposed on a triangular-shaped board.

Referring to FIGS. 16 and 17, a plurality of gate pads (GP), which are connected with gate lines (GL), and a plurality of data pads (DP), which are connected with data lines (DL), can be disposed on a first side of a triangular-shaped board 610. The data lines (DL) can be disposed parallel to a second side of the triangular-shaped board 610, and the gate lines (GL) can be disposed parallel to a third side of the triangular-shaped board 610. Also, the data lines (DL) and the gate lines (GL) can intersect. Also, two adjacent gate lines (GL2 and GL3) can be disposed close to each other between a first pixel (Pa) and a second pixel (Pb). Two pixels (Px and Py) disposed on the left and the right of a data line (DL3) from among the pixels connected with the data line (DL) can be connected with different gate lines (GL5 and GL6), respectively, through each corresponding switching transistor 630. However, this is not limiting.

A gate pad (GP) and a data pad (DP) formed on the first side of the board 610 can be connected with a gate-driving unit and a data-driving unit, respectively. Therefore, the gate-driving unit and the data-driving unit can be disposed close to the first side of a triangular-shaped board. Since the gate-driving unit and the data-driving unit are connected with the first side of the triangular-shaped board 610, a pad unit, a gate-driving unit, and a data-driving unit may not be disposed in the second side and the third side. Therefore, the second side and the third side can be thin, and a bezel disposed on the second side and the third side of the triangular-shaped board 610 can also be thin. Although it is illustrated that a data pad (DP) connected with the data-driving unit on the first side of the board 610 is directly connected with a data line, this is not limiting. A data link line 619a or 719a illustrated in FIG. 11 or 12 can connect a data line to a data pad (DP).

Also, a color filter 700 corresponding to a pixel area on a triangular-shaped board can be disposed as illustrated in FIG. 17. In the color filter 700, a triangular-shaped filter corresponding to a pixel shape may have one of red (CF-r), green (CF-g), blue (CF-b), and white (CF-w) colors. Therefore, the color filter 700 corresponding to the triangular-shaped board can be disposed on the board.

Here, although it is illustrated that the number of pixels disposed on the triangular-shaped board and the number of color filters are both 59, this is merely for illustrative purposes, and the present invention is not limited thereto.

Two or more display devices according to the above-described embodiments can be assembled into a multiple-display device.

Also, according to the embodiments of the present invention, a multiple-display device can display a continuous single image in three dimensions.

Although the display device and the multiple-display device according to the embodiments have been described with reference to drawings, the present invention is not limited thereto.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the features of the present invention. Therefore, the embodiments disclosed in the present invention are intended to illustrate the scope of the technical idea of the present invention, and the scope of the present invention is not limited by the embodiment. The scope of the present invention shall be construed based on the accompanying claims so all of the technical ideas included within the scope equivalent to the claims belong to the present invention.

What is claimed is:

1. A display device, comprising:
   a display panel including a plurality of data lines and a plurality of gate lines disposed on a triangular-shaped board, and a plurality of pixels disposed in a matrix arrangement, wherein a plurality of pixel rows of the matrix arrangement are arranged with a step for each at least one gate line among the plurality of gate lines based on a number of the plurality of pixels connected to each of the plurality of gate lines;
   a data-driving unit disposed on a first side of the triangular-shaped board, and configured to supply data voltages to the plurality of data lines to drive the plurality of data lines; and
   a gate-driving unit including a plurality of gate-in-panels (GIPs) disposed on a second side of the triangular-shaped board, wherein the plurality of gate-in-panels are arranged to correspond to the step for each of the at least one gate line and sequentially supply a gate signal to the plurality of gate lines to sequentially drive the plurality of gate lines.

2. The display device of claim 1, wherein each of the plurality of data lines is disposed in a first direction extending from the first side of the triangular-shaped board, and lengths of the plurality of data lines sequentially decrease from a center of the first side to an edge of the first side of the triangular-shaped board; and
   wherein the plurality of gate lines extend from the second side to a third side of the triangular-shaped board in a second direction, and lengths of the plurality of gate lines sequentially decrease as a distance away from the first side of the board increases.

3. The display device of claim 2, wherein the display panel further includes a data pad unit including a plurality of data pads disposed in a non-display area of the triangular-shaped board, and a data link line unit including a plurality of data link lines connecting the data pad unit to the plurality of data lines, and
   wherein lengths of the plurality of data link lines decrease and then increase, along the first side, from one end of the triangular-shaped board to another end the triangular-shaped board.

4. The display device of claim 1, wherein each gate-in-panel among the plurality of gate-in-panels has a first height (a),
   wherein the plurality of gate-in-panels are disposed along the second side or a third side of the triangular-shaped board based on a pitch (a/b) defined by the first height (a) divided by a number (b) in an oblique line inside the second side or the third side of the triangular-shaped board, and wherein the number (b) is a real number and less than the first height (a).

5. The display device of claim 1, wherein each of the plurality of gate lines are curved at a part where a pixel adjacent to the second side is located and corresponding to a direction in which an area of a light-emitting unit of the pixel decreases.

6. The display device of claim 5, wherein an electrostatic discharge (ESD) element is disposed in a non-light-emitting area of a pixel that is adjacent to the second side.

7. The display device of claim 1, wherein the display panel is provided in a plural number of display panels, and
wherein the display device has a polyhedron shape with multiple faces each corresponding to one display panel among the plural number of display panels.

8. The display device of claim 7, wherein the plural number of display panels are configured to display a single image in three dimensions.

9. The display device of claim 1, wherein the display panel is provided in a plural number of display panels, and
wherein the display device has a hemispheric shape with multiple faces each corresponding to one display panel among the plural number of display panels.

10. A display device, comprising:
a display panel including a plurality of gate lines and a plurality of data lines arranged in a plurality of rows and a plurality of columns on a board, respectively, wherein a length of at least one gate line among the plurality of gate lines is different than a length of an adjacent gate line among the plurality of gate lines based on a shape of the board, and a length of at least one data line among the plurality of data lines is different than a length of an adjacent data line among the plurality of data lines based on the shape of the board;
a plurality of pixels disposed at intersections where the plurality of gate lines intersect with the plurality of data lines, based on the shape of the board; and
a plurality of gate-in-panels connected to the plurality of gate lines, and configured to apply a gate signal to the plurality of gate lines.

11. The display device of claim 10, further comprising:
a data-driving unit connected to the plurality of data lines, and configured to transfer data signals to the plurality of data lines.

12. The display device of claim 10, wherein each gate-in-panel among the plurality of gate-in-panels has a first height (a) and the board is a triangular-shaped board,
wherein the plurality of gate-in-panels are disposed along a second side or a third side of the triangular-shaped board based on a pitch (a/b) defined by the first height (a) divided by a number (b) in an oblique line inside the second side or the third side of the triangular-shaped board, and
wherein the number (b) is a real number and less than the first height (a).

13. The display device of claim 10, wherein each of the plurality of gate lines is curved at a part where a pixel among the plurality of pixels is adjacent to a gate-in-panel among the plurality of get-in-panels and based on a direction in which an area of a light-emitting unit of the pixel decreases.

14. The display device of claim 10, wherein the display panel is provided in a plural number of display panels, and
wherein the display device has a polyhedron shape or half polyhedron shape with multiple faces each corresponding to one display panel among the plural number of display panels.

15. A display device, comprising:
a display panel including a plurality of data lines and a plurality of gate lines disposed on a triangular-shaped board;
a plurality of pixels disposed in a matrix arrangement corresponding to the triangular-shaped board based on a number of the plurality of pixels connected to each of the plurality of gate lines, wherein two adjacent triangular-shaped pixels among the plurality of pixels are disposed in opposite directions and form a parallelogram shape;
a data-driving unit disposed on a first side of the triangular-shaped board and configured to supply data voltages to the plurality of data lines to drive the plurality of data lines; and
a gate-driving unit disposed on the first side and configured to sequentially supply a gate signal to the plurality of gate lines to sequentially drive the plurality of gate lines.

16. The display device of claim 15, further comprising:
a plurality of data pads disposed on the first side and connected to the data-driving unit; and
a plurality of gate pads disposed on the first side and connected to the gate-driving unit, wherein the plurality of data lines are connected to the plurality of data pads, respectively, and are disposed parallel to a second side of the triangular-shaped board, and the plurality of gate lines are connected to the plurality of gate pads, respectively, and are disposed parallel to a third side of the triangular-shaped board, and
wherein two adjacent gate lines among the plurality of gate lines are disposed between two rows of pixels among the plurality of pixels that receive gate signals from the two adjacent gate lines, respectively.

17. The display device of claim 15, wherein two adjacent pixels among the plurality of pixels are liquid crystal cells having alignment layers oriented in different directions.

18. The display device of claim 15, wherein the display panel further includes a data link line unit including a plurality of data link lines connecting a data pad unit to the plurality of data lines.

19. The display device of claim 15, wherein the plurality of pixels are arranged in groups of four pixels having a triangular shape, and
wherein the four pixels include a red pixel, a blue pixel, a green pixel and a white pixel.

20. The display device of claim 15, wherein the display panel is provided in a plural number of display panels, and
wherein the display device has a polyhedron shape or half polyhedron shape with multiple faces each corresponding to one display panel among the plural number of display panels.

* * * * *